(12) United States Patent
Chen et al.

(10) Patent No.: US 10,408,230 B2
(45) Date of Patent: Sep. 10, 2019

(54) NOISE SUPPRESSION APPARATUS AND FAN MODULE USING THE SAME

(71) Applicant: Wistron Corporation, New Taipei (TW)

(72) Inventors: Jing-Lung Chen, New Taipei (TW); Po-Cheng Chen, New Taipei (TW); Yi-Hsieh Chiou, New Taipei (TW)

(73) Assignee: Wistron Corporation, New Taipei (TW)

( * ) Notice: Subject to any disclaimer, the term of this patent is extended or adjusted under 35 U.S.C. 154(b) by 453 days.

(21) Appl. No.: 15/145,810

(22) Filed: May 4, 2016

(65) Prior Publication Data

US 2017/0227019 A1    Aug. 10, 2017

(30) Foreign Application Priority Data

Feb. 5, 2016 (TW) .............................. 105103915 A (51) Int. Cl.
*F04D 29/66* (2006.01)
*F01N 1/16* (2006.01)
(Continued)

(52) U.S. Cl.
CPC ........... *F04D 29/665* (2013.01); *F01N 1/161* (2013.01); *F04D 17/16* (2013.01);
(Continued)

(58) Field of Classification Search
CPC .... F04D 29/665; F04D 29/663; A47L 9/0081; F01N 1/023; F01N 1/161; F01N 1/163; F01N 1/166; F02M 35/1261
(Continued)

(56) References Cited

U.S. PATENT DOCUMENTS 3,591,960 A * 7/1971 Paine ....................... B64G 1/66
                                                        236/68 R
4,079,808 A * 3/1978 Mizuno .................. F01N 1/166
                                                        181/237
(Continued)

FOREIGN PATENT DOCUMENTS

CN         101793213           2/2013
DE         3414864 A1 * 10/1985 ............... H01P 1/30
(Continued)

*Primary Examiner* — Richard A Edgar
*Assistant Examiner* — Topaz L. Elliott
(74) *Attorney, Agent, or Firm* — JCIPRNET (57) ABSTRACT

A noise suppression apparatus and a fan module using the same are provided. The noise suppression apparatus includes a resonator, a status indication unit, and a first thermoelectric component. The resonator is disposed on a sound transmission tube of a noise generation source, and includes a chamber and a clapboard disposed in the chamber. The status indication unit generates a control signal according to an operational status of the noise generation source. The first thermoelectric component is disposed in the resonator, and has a first terminal fixed on a sidewall of the chamber and a second terminal connected to the clapboard. The first thermoelectric component deforms in response to the control signal as the operational status of the noise generation source changes, so as to move the clapboard to change resonance volume of the resonator, and thus resonance frequency of the resonator approaches noise frequency of the noise generation source.

13 Claims, 5 Drawing Sheets

(51) Int. Cl.
  *H05K 7/20* (2006.01)
  *F04D 17/16* (2006.01)
  *G06F 1/20* (2006.01)
(52) U.S. Cl.
  CPC ..... *H05K 7/20136* (2013.01); *H05K 7/20172* (2013.01); *G06F 1/206* (2013.01)
(58) Field of Classification Search
  USPC .................................. 181/224, 225, 250
  See application file for complete search history.

(56) References Cited

U.S. PATENT DOCUMENTS

| | | | | |
|---|---|---|---|---|
| 4,546,733 A * | 10/1985 | Fukami | ............... | F01N 1/006 123/184.57 |
| 5,930,371 A * | 7/1999 | Cheng | ............... | F01N 1/023 381/71.5 |
| 6,792,907 B1 | 9/2004 | Kostun et al. | | |
| 7,757,808 B1 * | 7/2010 | Vaz | ............... | F01N 1/02 123/184.57 |
| 8,408,358 B1 * | 4/2013 | Hermiller | ............... | F02K 1/827 181/229 |
| 9,135,908 B2 * | 9/2015 | Mekid | ............... | H04R 1/2873 |
| 2004/0071546 A1 | 4/2004 | Werner et al. | | |
| 2005/0161280 A1 * | 7/2005 | Furuya | ............... | F01N 1/003 181/225 |
| 2014/0341385 A1 * | 11/2014 | Mekid | ............... | G10K 11/161 381/71.5 |
| 2017/0176009 A1 * | 6/2017 | Szwedowicz | ............... | F02C 7/00 |

FOREIGN PATENT DOCUMENTS

| | | | | |
|---|---|---|---|---|
| DE | 19747847 A1 * | 5/1999 | ............... | H01P 7/084 |
| SU | 681477 | * 8/1979 | ............... | H01J 5/16 |
| SU | 681482 | * 8/1979 | ............... | H01P 7/06 |

* cited by examiner

NOISE SUPPRESSION APPARATUS AND FAN MODULE USING THE SAME

CROSS-REFERENCE TO RELATED APPLICATION

This application claims the priority benefit of Taiwan application serial no. 105103915, filed on Feb. 5, 2016. The entirety of the above-mentioned patent application is hereby incorporated by reference herein and made a part of this specification.

BACKGROUND OF THE INVENTION

Field of the Invention

The invention relates to a noise suppression technique used for mechanical apparatuses, and particularly, to a noise suppression apparatus and a fan module using the same.

Description of Related Art

In this information explosion era, electronic products have become inseparable from daily life. As technology continuously advances, various electronic products emerge and develop. In terms of development and application of personal computers, desktop personal computers (desktop PCs) were first developed. However, due to disadvantages of the desktop PCs, such as larger volume and poor portability, etc., portable electronic apparatuses that are easy to carry, such as notebook PCs and tablet PCs, were then developed.

As a portable electronic apparatus becomes lighter and thinner, number of components accommodated per unit volume increases rapidly. Accordingly, a heat dissipation apparatus is required for effectively dissipating heat generated by a heating element to the outside, so as to ensure normal operation of the portable electronic apparatus. A fan module is one of the most frequently used heat dissipation apparatuses. The fan module blows off or extracts out hot air near the heating element through a fan, so that the heat generated by the heating element is carried away by the nearby air, thereby achieving a heat dissipation effect.

However, the fan module easily produces noise when operating, and the noise will be transmitted from the fan to outside the electronic apparatus and will then be sensed by a user. A frequency of the noise generated by a common fan is approximately 500 Hz to 2000 Hz, which belongs to a middle audio frequency range, causing harshness and irritation to the user's ear.

In order to reduce the noise of the operating fan module, conventionally, the rotational speed is decreased, or foam rubber is attached to an outlet tube for absorbing the noise. However, such noise reduction methods are not suitable for the current design demand for lighter and thinner electronic apparatuses.

SUMMARY OF THE INVENTION

The invention provides a noise suppression apparatus and a fan module using the same, which may solve the aforementioned problems of the prior art.

The noise suppression apparatus of the invention is suitable for suppressing noise generated by a noise generation source. The noise suppression apparatus includes a resonator, a status indication unit, and a first thermoelectric material. The resonator is disposed on a sound transmission tube of the noise generation source, wherein the resonator includes a chamber and a clapboard disposed in the chamber. The status indication unit generates a control signal according to an operational status of the noise generation source. The first thermoelectric material is disposed in the resonator, wherein a first terminal of the first thermoelectric material is fixed on a sidewall of the chamber, and a second terminal of the first thermoelectric material is connected to the clapboard. The first thermoelectric material deforms in response to the control signal as the operational status of the noise generation source changes, so as to change resonance volume of the resonator, and thus resonance frequency of the resonator approaches noise frequency of the noise generation source.

In an embodiment of the invention, the resonator further includes a neck channel and an elastic component. The neck channel has one end connected to an opening of the chamber, and has another end connected to the sound transmission tube. The elastic component has one end connected to the bottom of the chamber, and has another end connected to the clapboard. The clapboard separates a space in the chamber into a first space surrounded by the bottom of the chamber and the clapboard, and a second space opposed to the first space. The first thermoelectric material is disposed in the first space, and the resonance volume is determined by the second space.

In an embodiment of the invention, the first terminal of the first thermoelectric material is connected to the status indication unit via a signal cable passing through the sidewall of the chamber.

In an embodiment of the invention, the first thermoelectric material includes a first metal component and a second metal component. The first metal component has a first dilatation coefficient. The second metal component has a second dilatation coefficient. The second metal component is bonded to the first metal component and is connected to the clapboard. The second dilatation coefficient is larger than the first dilatation coefficient.

In an embodiment of the invention, the noise suppression apparatus further includes a masking component and a second thermoelectric material. The masking component is disposed in the neck channel. The second thermoelectric material is connected to the masking component, and deforms in response to the control signal as the operational status of the noise generation source changes, so that the masking component blocks or opens the neck channel.

In an embodiment of the invention, the second thermoelectric material and the first thermoelectric material deform to different extents.

In an embodiment of the invention, the status indication unit includes a heat conduction component. The heat conduction component is connected between the noise generation source and the first thermoelectric material, and conducts heat energy of the noise generation source, as the control signal, to the first thermoelectric material.

In an embodiment of the invention, the status indication unit includes a control chip. According to different operational statuses of the noise generation source, the control chip correspondingly generates a voltage of different levels, and transmits the voltage as the control signal to the first thermoelectric material.

The fan module of the invention is suitable for dissipating heat for an electronic apparatus. The fan module includes a fan body and a noise suppression apparatus. The fan body has an outlet tube, wherein the outlet tube has a silencing opening thereon. The noise suppression apparatus includes a resonator, a status indication unit, and a first thermoelectric material. The resonator is disposed at the silencing opening of the outlet tube, wherein the resonator includes a chamber and a clapboard disposed in the chamber. The status indication unit generates a control signal according to an operational status of at least one of the fan body and the electronic apparatus. A first terminal of the first thermoelectric material is fixed on a sidewall of the chamber and a second terminal of the first thermoelectric material is connected to the clapboard. The first thermoelectric material deforms in response to the control signal as the operational status of the at least one of the fan body and the electronic apparatus changes, so as to move the clapboard to change resonance volume of the resonator, and thus resonance frequency of the resonator approaches noise frequency of the fan body.

Based on the above, the invention proposes a noise suppression apparatus and a fan module using the same. The noise suppression apparatus utilizes a characteristic of the thermoelectric material of deforming with heat or voltage. By configuration of the thermoelectric material in the resonator to modulate the resonance volume of the resonator, the resonance frequency of the resonator changes with the noise frequency, and thereby effects of sound absorption and noise reduction are achieved.

To make the above features and advantages of the invention more comprehensible, embodiments accompanied with drawings are described in detail as follows.

DETAILED DESCRIPTION OF DISCLOSED EMBODIMENTS

In order to make the disclosure more comprehensible, embodiments are described below as the examples to demonstrate that the disclosure can actually be realized. In the following embodiments, wordings used to indicate directions, such as "up," "down," "front," "back," "left," and "right", merely refer to directions in the accompanying drawings. Therefore, the directional wording is used to illustrate rather than limit the invention. Moreover, wherever appropriate in the drawings and embodiments, elements/components/steps with the same reference numerals represent the same or similar parts.

Figure 1:
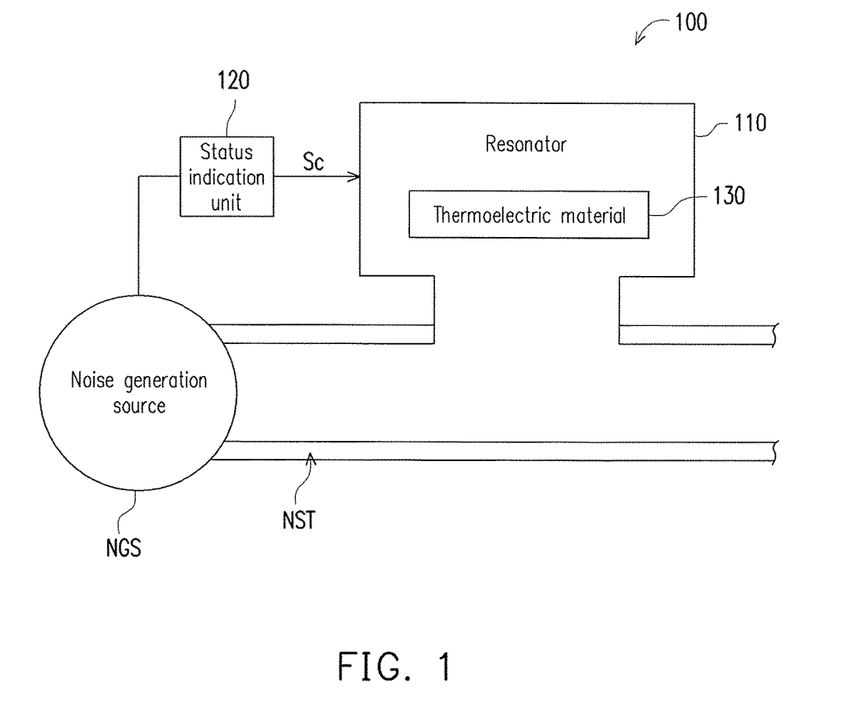
FIG. 1 is a schematic view of a configuration of a noise suppression apparatus according to an embodiment of the invention.

FIG. 1 is a schematic view of a configuration of a noise suppression apparatus according to an embodiment of the invention. A noise suppression apparatus 100 in the present embodiment is suitable for suppressing noise generated by a noise generation source NGS. The noise generation source NGS described herein generally refers to any apparatus, such as a fan module, an internal combustion engine, or a compressor, etc., capable of performing a rapid and repeated mechanical movement such as rotating and shifting, etc., and generating noise having a specific frequency according to the mechanical movement.

Referring to FIG. 1, the noise suppression apparatus 100 in the present embodiment includes a resonator 110, a status indication unit 120 and a thermoelectric material 130. The resonator 110 is disposed on a sound transmission tube NST of the noise generation source NGS and communicates with the sound transmission tube NST. The resonator 110 is, e.g., a Helmholtz resonator, and at least includes a chamber and a clapboard disposed in the chamber (both of which are not illustrated in FIG. 1 and will be described in detail in the following embodiments).

According to an operational status (e.g., temperature, rotational speed, etc.) of the noise generation source NGS, the status indication unit 120 generates a corresponding control signal Sc, and provides the control signal Sc to the thermoelectric material 130. The control signal Sc may be a heat signal or an electric signal.

The thermoelectric material 130 has one terminal fixed on a sidewall of the chamber of the resonator 110, and has the other terminal connected to the clapboard disposed in the chamber. In the present embodiment, the thermoelectric material 130 deforms in response to the received control signal Sc as the operational status of the noise generation source NGS changes. Through the configuration of the thermoelectric material 130 inside the resonator 110, the deformation of the thermoelectric material 130 causes a change in resonance volume of the resonator 110, thus changing resonance frequency of the resonator 110. For example, the deformation that occurs in the thermoelectric material 130 in response to the control signal Sc applies a push force to the clapboard in the chamber of the resonator 110 to move the clapboard, wherein a position of the clapboard in the chamber determines the resonance volume of the resonator 110. Therefore, in the noise suppression apparatus in the present embodiment, by disposing the thermoelectric material 130 between the chamber sidewall and the clapboard of the resonator 110, an effect of adjusting the resonance frequency based on the control signal Sc is achieved.

Specifically, the Helmholtz resonance principle is utilized in the present embodiment in which the resonance volume of the resonator 110 is modulated so that the resonance frequency of the resonator 110 approaches noise frequency of the noise generation source NGS. When the noise frequency of the noise generation source NGS matches the resonance frequency of the resonator 110, the system causes resonance to strongly amplify vibration of a sound wave. At this moment, to overcome friction on the chamber sidewall in the resonator 110, sound energy of the sound wave is considerably consumed. Accordingly, effects of sound absorption and noise reduction are achieved.

In addition, the noise frequency of the noise generation source NGS is generally related to the operational status of the same. For example, in a fan module, the faster the fan speed, the higher the noise frequency. In the present embodiment, according to the operational status of the noise generation source NGS, the status indication unit 120 generates the corresponding control signal Sc to control an amount of deformation in the thermoelectric material 130. Accordingly, the resonance volume of the resonator 110 is changed with the operational status such as rotational speed, temperature, etc., so that the resonance frequency of the resonator 110 approaches the noise frequency of the noise generation source NGS, and an effect of noise suppression is thus achieved.

Figure 2A:
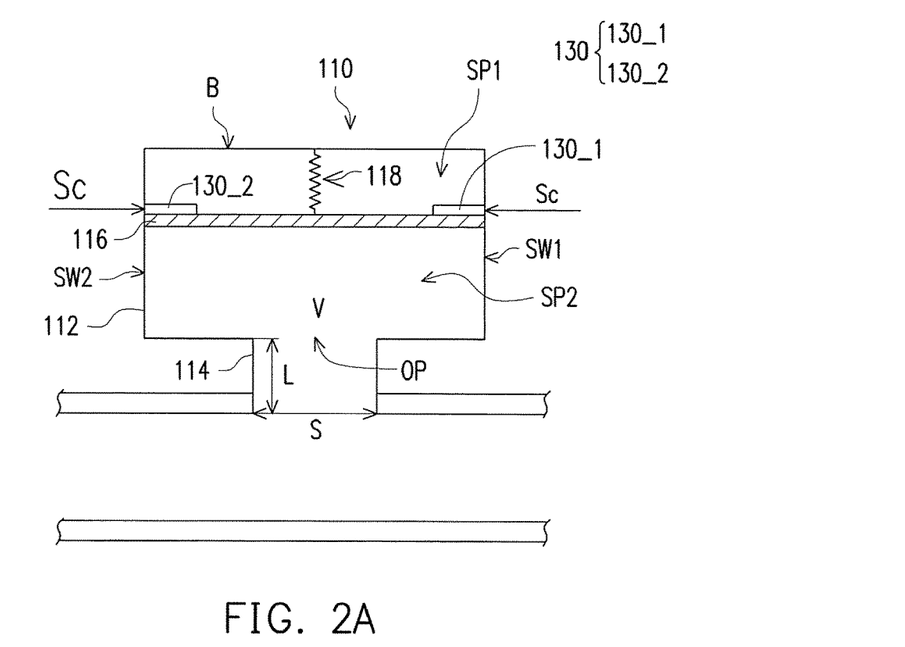
FIGS. 2A and 2B are schematic cross-sectional views of the noise suppression apparatus according to an embodiment of the invention.
Figure 2B:
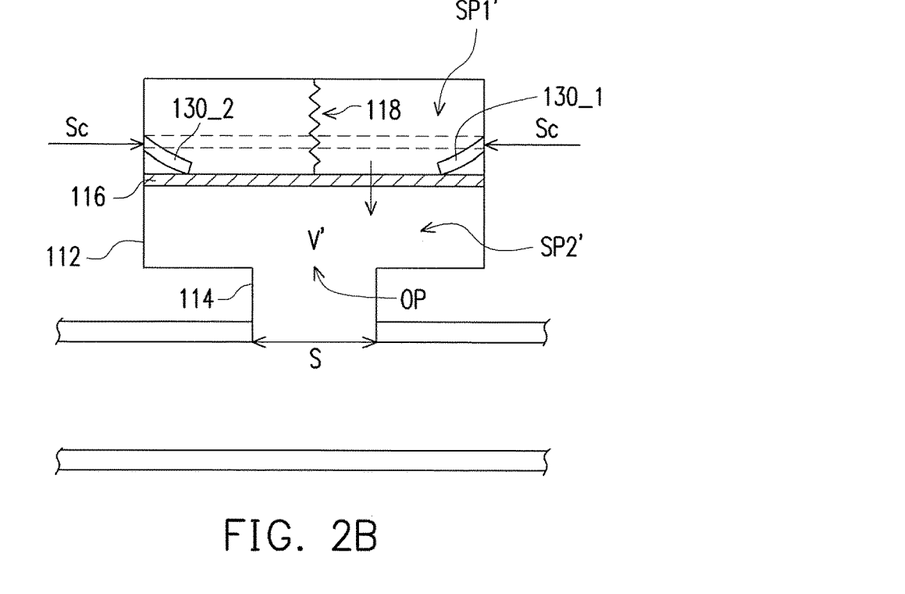

In the following, a specific example of how the noise suppression apparatus 100 is disposed and operates is described with reference to FIGS. 2A and 2B. FIGS. 2A and 2B are schematic cross-sectional views of the noise suppression apparatus according to an embodiment of the invention.

Referring first to FIG. 2A, in the present embodiment, the resonator 110 is shown as having a Helmholtz resonator structure for exemplary purposes, which includes a chamber 112, a neck channel 114, a clapboard 116 and an elastic component 118. In addition, the thermoelectric material 130 is exemplified by two thermocouples 130_1 and 130_2. However, the invention is not limited thereto.

The chamber 112 herein would be, for example, a box-shaped or cube-shaped structure, wherein an opening OP is provided opposite a bottom B of the chamber 112, and the opening OP has a shape and size corresponding to the neck channel 114. One end of the neck channel 114 is connected to the chamber 112 at the opening OP, and another end of the neck channel 114 is connected to the sound transmission tube NST, thereby communicating the sound transmission tube NST with space in the chamber 112. The neck channel 114 is, e.g., a hollow cylindrical tube having an inner diameter smaller than that of the chamber 112. Thus, the entirety of the chamber 112 and the neck channel 114 would form the Helmholtz resonator structure.

The clapboard 116 is disposed in the chamber 112, so as to separate the space in the chamber 112 into a space SP1 surrounded by the bottom B, a portion of sidewalls SW1 and SW2, and an upper side of the clapboard 116, and a space SP2 (i.e., the space surrounded by a lower side of the clapboard 116 and the neck channel 114) opposed to the space SP1. In the present embodiment, only the space SP2 is communicated with the sound transmission tube NST, and the space SP1 is isolated by the clapboard 116. Therefore, an actual resonance volume V of the resonator 110 is determined according to the size of the space SP2.

The elastic component 118 is, e.g., a component, such as a spring or an elastic piece, etc., capable of fixing the clapboard 116 in a predetermined position without receiving any additional force (i.e., without receiving any force other than gravity of the clapboard 116). The elastic component 118 has one end connected to the bottom B of the chamber 112, and has the other end connected to the clapboard 116. In the present embodiment, the elastic component 118 is disposed along the direction of gravity. When not influenced by the thermoelectric material 130, the clapboard 116 receives a pulling force from the elastic component 118 so as to be balanced in a predetermined position which allows the space SP2 to have the volume V. In other words, the predetermined resonance volume V is defined by selecting the elastic component 118 having different elastic coefficients. In actual application, according to the frequency of noise that may be generated by the noise generation source NGS in normal operation, the designer sets a corresponding predetermined resonance volume V, so that a predetermined resonance frequency of the resonator 110 is equivalent to the noise frequency of the noise generation source NGS in normal operation.

The thermocouples 130_1 and 1302 are disposed in the space SP1 and located respectively on two symmetrical sides of the clapboard 116. The thermocouple 130_1 has one terminal fixed on the sidewall SW1, and has the other terminal connected to (adhering to or abutting against, which is not limited herein) the clapboard 116. The thermocouple 130_2 has one terminal fixed on the sidewall SW2, and has the other terminal connected to the clapboard 116.

The present embodiment describes an example in which the thermocouples 130_1 and 130_2 have not yet deformed. Therefore, in FIG. 2A, the thermocouples 130_1 and 130_2 are illustrated as being placed flat on the clapboard 116. It is to be noted that under such a condition, the thermocouples 130_1 and 130_2 that have not yet deformed still apply pressure to the clapboard 116 due to gravity. However, since the weight of the thermocouples 130_1 and 130_2 is included in the weight of the clapboard 116, this situation is regarded as belonging to cases where the elastic component 118 receives no additional force.

It should also be mentioned that although the chamber 112 herein is illustrated as having a box-shaped or cube-shaped structure, it may have a cylindrical shape, a spherical shape or any other shape. The invention is not limited thereto.

When the operational status of the noise generation source NGS is normal operation, the resonator 110 is disposed as shown in FIG. 2A. According to a formula of the Helmholtz resonator, the resonance frequency at this moment is expressed by the following Equation (1):

$$f_0 = \frac{c}{2\pi}\sqrt{\frac{S}{(L \times V)}} \tag{1}$$

S represents a cross-sectional area of the neck channel 114; $f_0$ represents the resonance frequency of the resonator 110; c represents a sound speed; L represents a length of the neck channel 114; and V represents the resonance volume of the chamber 112 in the space SP2.

In other words, the resonance frequency $f_0$ is related to the sound speed c, the cross-sectional area S of the neck channel 114, the length L of the neck channel 114, and the resonance volume V. In the embodiment of the invention, the resonance frequency $f_0$ is changed by modulation of the resonance volume V. The sound speed c, the cross-sectional area S of the neck channel 114, and the length L of the neck channel 114 are all fixed.

When the operational status of the noise generation source NGS changes to increase the noise frequency, the thermocouples 130_1 and 130_2 deform in response to the control signal Sc, so that the resonance volume of the resonator 110 is decreased from V to V', as shown in FIG. 2B.

Specifically, when heated or receiving higher voltage, the thermocouples 130_1 and 130_2 dilate, bend and deform due to material characteristics, so that the terminals of the thermocouples 130_1 and 1302 connected to the clapboard 116 apply downward pressure to the clapboard 116. Accordingly, the clapboard 116 is pushed to shift toward the opening OP of the chamber 112. After the reactions of the thermocouples 130_1 and 130_2 are stable, volume of a space SP1' above the clapboard 116 is increased (from SP1 to SP1'), while a space SP2' below the clapboard 116 is correspondingly decreased (from SP2 to SP2'). In other words, the resonance volume V' in the present embodiment is decreased as compared to FIG. 2A.

It is known from the Equation (1) that the resonance frequency f0 is negatively correlated with the resonance volume V. Thus, as the resonance volume is decreased from V to V', the resonance frequency f0 is increased accordingly. In addition, since the amount of deformation in the thermoelectric material 130 is estimated accurately according to a selection of the material characteristics of the thermoelectric material 130, through the selection and configuration of the thermoelectric material 130 and the elastic component 118, an effect of controlling the clapboard 116 to have a displacement corresponding to different noise frequencies, so that the resonance frequency f0 changes with the noise frequency is achieved.

Figure 3:
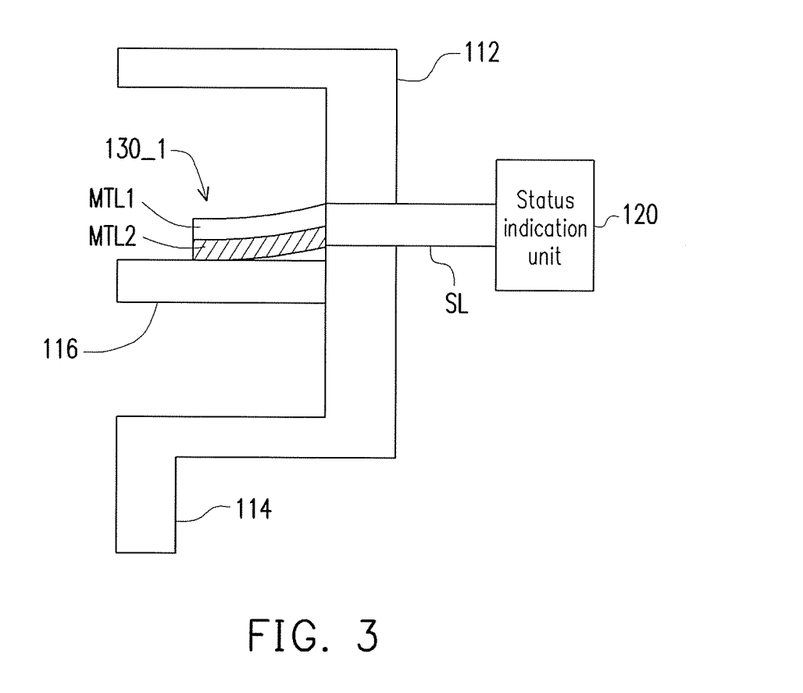
FIG. 3 is a schematic view of a configuration of a thermoelectric material according to an embodiment of the invention.

In the following, a specific example of the structure of the thermoelectric material 130 and its specific configuration in the chamber 112 is described with reference to FIG. 3. FIG. 3 is a schematic view of a configuration of a thermoelectric material according to an embodiment of the invention.

Referring to FIG. 3, the present embodiment describes the thermocouple 130_1 disposed on the right side of the chamber 112 for exemplary purposes. The thermocouple 130_2 disposed on the left side of the chamber 112 is basically the same as the thermocouple 130_1, and a description thereof is thus omitted.

In the present embodiment, the thermocouple 130_1 is formed by bonding together two metal components MTL1 and MTL2 having different dilatation coefficients. In actual application, a combination of the metal components MTL1 and MTL2 is, e.g., platinum and germanium, nickel and chromium, nickel and aluminum, or nickel and silicon, etc.

The metal component MTL2 having a larger dilatation coefficient is disposed on a lower side (i.e., the side closer to the clapboard 116), and the metal component MTL1 having a smaller dilatation coefficient is disposed on an upper side (i.e., the side closer to the bottom B). The metal components MTL1 and MTL2 have one terminal connected to a signal cable SL that passes through the sidewall SW1 of the chamber 112, and are connected to the status indication unit 120 outside the chamber 112 via the signal cable SL. The other terminal of the metal components MTL1 and MTL2 is connected to the clapboard 116 (wherein mainly the metal component MTL2 contacts the clapboard 116).

In the present embodiment, since the dilatation coefficient of the metal component MTL2 is larger than the dilatation coefficient of the metal component MTL1, when the thermocouple 130_1 is heated or conducted, the metal component MTL2 deforms to a larger extent than the metal component MTL1, so that the thermocouple 130_1 bends toward the metal component MTL1 having the smaller dilatation coefficient. At this moment, the bending thermocouple 130_1 applies downward stress to the clapboard 116 so that the clapboard 116 is shifted downward due to the received force. Accordingly, a change is caused in the resonance volume V.

Figure 4A:
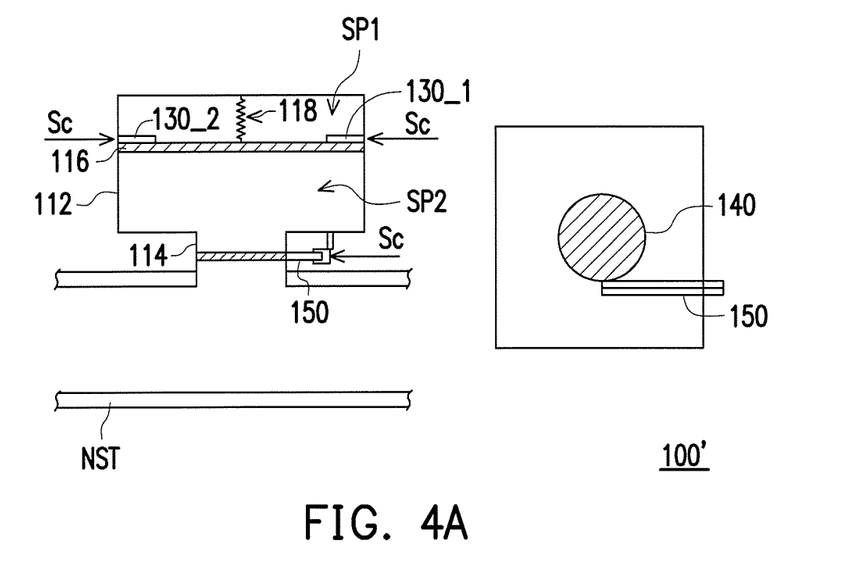
FIGS. 4A and 4B are schematic views of a structure of a noise suppression apparatus according to another embodiment of the invention.
Figure 4B:
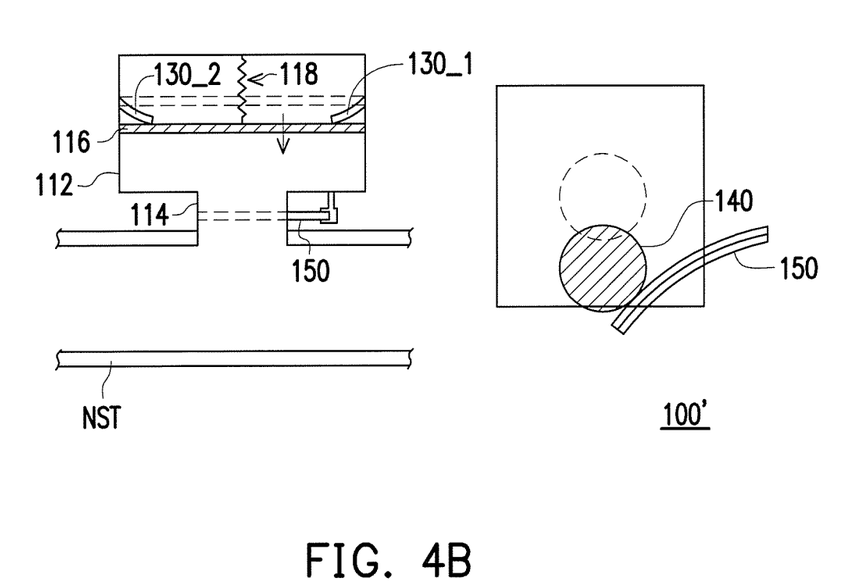

FIGS. 4A and 4B are schematic views of a structure of a noise suppression apparatus according to another embodiment of the invention. The structure in the present embodiment is approximately the same as the structure of the noise suppression apparatus 100 illustrated in FIG. 3. The main difference between two embodiments is, in a noise suppression apparatus 100' of the present embodiment, a masking component 140 and a thermoelectric material 150 capable of controlling the masking component 140 are additionally disposed at the neck channel 114. The thermoelectric material 150 herein may also be, e.g., a thermocouple, but the invention is not limited thereto.).

Referring to FIG. 4A, the left side of FIG. 4A illustrates a cross-sectional view of the noise suppression apparatus 100', and the right side of FIG. 4A illustrates a top view of the noise suppression apparatus 100'.

In the present embodiment, the masking component 140 is disposed in the neck channel 114 and has a shape corresponding to the neck channel 114. In this example, the neck channel 114 is illustrated as being a cylindrical channel. Accordingly, the masking component 140 is configured as a disk shape. The thermoelectric material 150 has one terminal connected to the masking component 140, and has the other terminal fixed around the neck channel 114 by means of a fixing mechanism connected to the chamber 112 or the sound transmission tube NST.

When the operational status of the noise generation source NGS is normal operation, the resonator 110 is disposed as shown in FIG. 4A. At this moment, since the thermoelectric material 150 has not yet deformed, the masking component 140 separates the space SP2 inside the resonator 110 from the space in the sound transmission tube NST, so that airflows in the sound transmission tube NST and the space SP2 would not be circulated to each other. In other words, under such a condition, the noise suppression apparatus 100' has no effect on the noise generation source NGS.

When the operational status of the noise generation source NGS changes to increase the noise frequency, not only the thermocouples 130_1 and 130_2 deform in response to the control signal Sc so as to decrease the resonance volume of the resonator 110, but also the thermoelectric material 150 deforms in response to the control signal Sc, as shown in FIG. 4B.

Bending of the thermoelectric material 150 causes the masking component 140 to move so as to open the neck channel 114, so that the space SP2 inside the resonator 110 communicates with the sound transmission tube NST. At this moment, the noise suppression apparatus 100' starts to suppress the noise at the resonance frequency.

In brief, when the noise generation source NGS is in normal operation (e.g., when the fan module operates at a low rotational speed), the noise generated is weaker and is usually less noticeable to the user, and thus has only minor influence. If the noise suppression apparatus 100' is implemented when there is only weak noise, the effect of noise suppression may not be achieved, and even worse, the noise may be intensified instead due to configuration error in hardware. Therefore, compared to the embodiment in FIGS. 2A and 2B, the noise suppression apparatus 100' in the present embodiment is designed in a manner that when (or only when) the noise generated by the noise generation source NGS is more noticeable (i.e., when the noise frequency is higher), the noise suppression apparatus 100' would be implemented by the thermoelectric material 150 driving the masking component 140 to move to open the neck channel 114. The designer may control the timing of opening the neck channel 114 by selecting the thermoelectric material 150 having different dilatation coefficients. In other words, what should be taken into consideration in selecting the thermoelectric material 150 is different from that in selecting the thermoelectric material 130. Therefore, the thermoelectric material 150 may have a dilatation coefficient different from that of the thermoelectric material 130.

Figure 5:
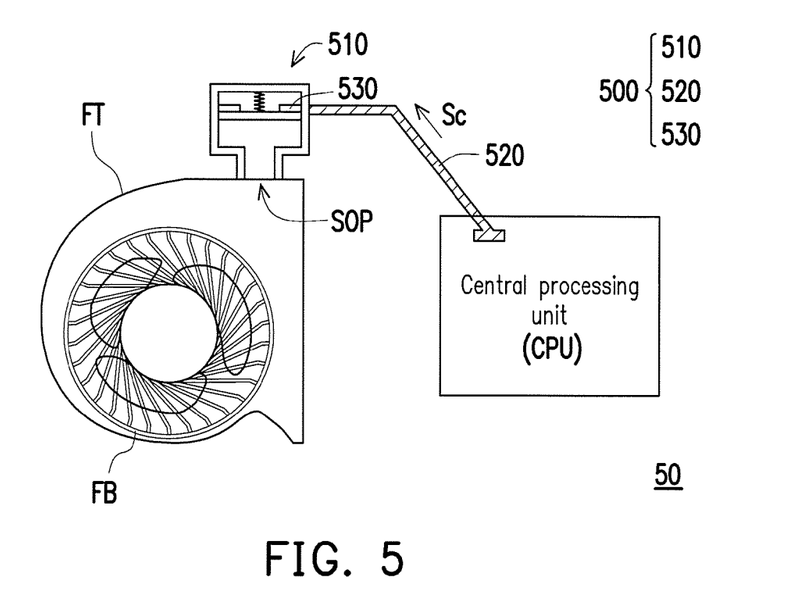
FIG. 5 is a schematic view of a configuration of a fan module according to an embodiment of the invention.
Figure 6:
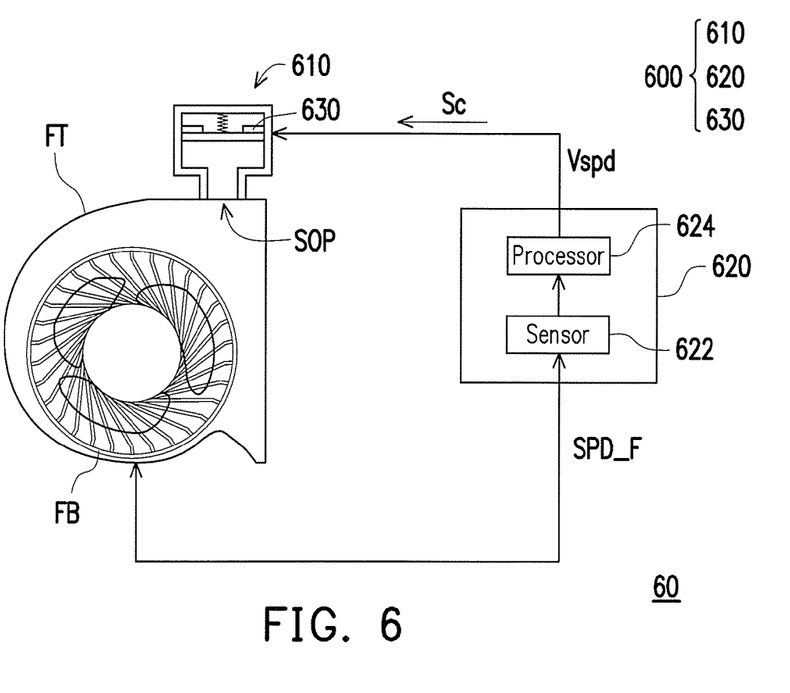
FIG. 6 is a schematic view of a configuration of a fan module according to another embodiment of the invention.

In the following, a specific example of applying the aforementioned noise suppression apparatus to the fan module is described with reference to FIGS. 5 and 6. FIG. 5 is a schematic view of a configuration of a fan module according to an embodiment of the invention. FIG. 6 is a schematic view of a configuration of a fan module according to another embodiment of the invention.

Referring first to FIG. 5, a fan module 50 in the present embodiment is suitable for dissipating heat for an electronic apparatus, and includes a fan body FB and a noise suppression apparatus 500. In the present embodiment, the electronic apparatus is, e.g., a notebook computer, and the fan module 50 is a fan module for performing heat dissipation for an electronic component such as a central processing unit (CPU) or a power supply unit (PSU) inside the electronic apparatus. FIG. 5 illustrates an example of heat dissipation for a CPU. However, the invention is not limited thereto.

The fan body FB has an outlet tube FT, and the outlet tube FT has a silencing opening SOP thereon. During operation of the fan body FB, a wheel hub causes fan blades to rotate so as to disturb the air, so that the air be circulated to form an airflow which passes through the outlet tube FT to be transmitted to the electronic component (a CPU herein) corresponding to the fan module 50. Compared to the aforementioned embodiments, when the fan blades produce the airflow, a vibration frequency detectable by human ears is generated. Therefore, the fan body FB may be viewed as the aforementioned noise generation source, and the outlet tube FT may be viewed as the aforementioned sound transmission tube.

The noise suppression apparatus 500 in the present embodiment includes a resonator 510, a heat conduction component 520 and a thermoelectric material 530. The configuration of the resonator 510 and the thermoelectric material 530 is as described in the aforementioned embodiments.

The heat conduction component 520 is used as a status indication unit for indicating an operational status of the electronic apparatus, and is connected between the electronic apparatus and the thermoelectric material 530. Since the fan module 50 in the present embodiment is illustrated as performing heat dissipation for the CPU in the electronic apparatus, a rotational speed of the fan body FB is directly related to temperature of the CPU. Therefore, the heat conduction component 520 in the present embodiment is illustrated as being connected between the CPU and the thermoelectric material 530.

The heat conduction component 520 conducts heat energy of the CPU, as the control signal Sc, to the thermoelectric material 530, so that temperature of the thermoelectric material 530 increases with the temperature of the CPU, and the thermoelectric material 530 deforms accordingly. More specifically, in general control of the rotational speed of the fan module 50, whether to increase the rotational speed is determined according to the temperature of the CPU. When the fan speed is increased, the noise frequency is increased to render the noise more noticeable to the user. Thus, in the present embodiment, the noise suppression apparatus 500 adjusts the resonance volume of the resonator 510 by means of the thermoelectric material 530 that deforms as the temperature of the CPU changes, so as to eliminate the noise generated by the fan body FB. In other words, in the present embodiment, temperature and heat energy are mainly used as the control signal Sc for controlling an amount of deformation in the thermoelectric material 530. Under such control, the resonance volume of the resonator 510 is changed synchronously with and/or following a change in the temperature of the CPU.

In addition, description of specific operating manners of the resonator 510 and the thermoelectric material 530 may be found in the aforementioned embodiments and is not repeated herein.

Referring to FIG. 6, a fan module 60 in the present embodiment is also suitable for dissipating heat for an electronic apparatus, and includes the fan body FB and a noise suppression apparatus 600. The configuration of the fan body FB is as described in the aforementioned embodiment.

The noise suppression apparatus 600 in the present embodiment includes a resonator 610, a control chip 620 and a thermoelectric material 630. The configuration of the resonator 610 and the thermoelectric material 630 is as described in the aforementioned embodiment.

The control chip 620 is used as the status indication unit for indicating the operational status of the electronic apparatus. Since the electronic apparatus itself generally has hardware for controlling operation and rotational speed of the fan module 60, the control chip 620 in the present embodiment is implemented by an existing hardware in the electronic apparatus. The control chip 620 includes, e.g., a sensor 622 and a processor 624.

In the present embodiment, the sensor 622 is configured to sense a fan speed SPD_F of the fan body FB, and accordingly generates a signal indicating the fan speed SPD_F to the processor 624. According to the signal received from the sensor 622 that indicates different fan speeds SPD_F, the processor 624 generates a voltage Vspd of different levels, and transmits, as the control signal Sc, the voltage Vspd to the thermoelectric material 630 via a signal cable. Thus, in the present embodiment, the noise suppression apparatus 600 adjusts the resonance volume of the resonator 610 by means of the thermoelectric material 630 that deforms as the fan speed SPD_F changes, so as to eliminate the noise generated by the fan body FB. In other words, in the present embodiment, the voltage Vspd is mainly used as the control signal Sc for controlling an amount of deformation in the thermoelectric material 630.

Compared to the case in which the amount of deformation in the thermoelectric material 530 is controlled by the temperature as the control signal Sc, in the present embodiment, a voltage signal is used for control so as to accomplish more precise and multistage control, and the effect of noise suppression is further enhanced. For example, in an exemplary embodiment, the control chip 620 provides a stepped voltage Vspd to the thermoelectric material 630 according to different ranges of fan speed, so that the thermoelectric material 630 adjusts the resonance volume of the resonator 610 in a stepped manner within the different ranges of fan speed in response to the voltage Vspd. For example, the control chip 620 provides a 5V voltage when the fan speed is 60 rpm to 200 rpm, a 10 V voltage when the fan speed is 200 rpm to 500 rpm, and a 15 V voltage when the fan speed is 500 rpm to 1000 rpm, and so on.

It is certain that an effect similar to the control of the resonance volume by the temperature can be achieved by using the voltage signal as the control signal Sc. For example, in another exemplary embodiment, the control chip 620 transforms different fan speeds to corresponding voltages Vspd using a mapping function so that the resonance volume of the resonator 610 is changed synchronously with or following a change in the fan speed. The invention is not limited thereto.

In summary, the invention proposes a noise suppression apparatus and a fan module using the same. The noise suppression apparatus utilizes a characteristic of the thermoelectric material of deforming with heat or voltage. By configuration of the thermoelectric material in the resonator to modulate the resonance volume of the resonator, the resonance frequency of the resonator changes with the noise frequency, and thereby the effects of sound absorption and noise reduction are achieved.

Although the invention has been described with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A noise suppression apparatus adapted to suppress noise generated by a noise generation source, comprising:
a resonator, disposed on a sound transmission tube of the noise generation source, wherein the resonator comprises a chamber, a clapboard disposed in the chamber, and an elastic component, wherein the elastic component has one end connected to a bottom of the chamber and has another end connected to the clapboard;
a status indication unit, generating a control signal according to an operational status of the noise generation source; and
a first thermoelectric material, disposed in the resonator, comprising:
a first metal component, having a first expansion coefficient; and
a second metal component, having a second expansion coefficient,
wherein the second metal component is bonded to the first metal component and is connected to the clapboard,
wherein the second expansion coefficient is larger than the first expansion coefficient, wherein a first terminal of the first thermoelectric material is connected to the status indication unit via a signal cable passing through a sidewall of the chamber and a second terminal of the first thermoelectric material is connected to the clapboard, wherein the first thermoelectric material deforms in response to the control signal as the operational status of the noise generation source changes, so as to move the clapboard to change a resonance volume of the resonator.

2. The noise suppression apparatus of claim 1, wherein the resonator further comprises:
a neck channel, having one end connected to an opening of the chamber and having another end connected to the sound transmission tube,
wherein a space in the chamber is separated into a first space surrounded by the bottom of the chamber and the clapboard and a second space opposed to the first space,
wherein the first thermoelectric material is disposed in the first space, and the resonance volume is determined by the second space.

3. The noise suppression apparatus of claim 2, further comprising:
a masking component, disposed in the neck channel; and
a second thermoelectric material, connected to the masking component, wherein the second thermoelectric material deforms in response to the control signal as the operational status of the noise generation source changes, so that the masking component blocks or opens the neck channel.

4. The noise suppression apparatus of claim 3, wherein the second thermoelectric material and the first thermoelectric material deform to different extents.

5. The noise suppression apparatus of claim 1, wherein the status indication unit comprises:
a heat conduction component, connected between the noise generation source and the first thermoelectric material, and conducting heat energy of the noise generation source, as the control signal, to the first thermoelectric material.

6. The noise suppression apparatus of claim 1, wherein the status indication unit comprises:
a control chip, according to different operational statuses of the noise generation source, correspondingly generating voltage of different levels, and transmitting the voltage as the control signal to the first thermoelectric material.

7. A fan module adapted to dissipate heat for an electronic apparatus, comprising:

a fan body, having an outlet tube, wherein the outlet tube has a silencing opening thereon; and
a noise suppression apparatus, comprising:
a resonator, disposed at the silencing opening of the outlet tube, wherein the resonator comprises a chamber, a clapboard disposed in the chamber, and an elastic component, wherein the elastic component has one end connected to a bottom of the chamber and has another end connected to the clapboard;
a status indication unit, generating a control signal according to an operational status of at least one of the fan body and the electronic apparatus; and
a first thermoelectric material, disposed in the resonator, comprising:
a first metal component, having a first expansion coefficient; and
a second metal component, having a second expansion coefficient,
wherein the second metal component is bonded to the first metal component and is connected to the clapboard,
wherein the second expansion coefficient is larger than the first expansion coefficient, wherein a first terminal of the first thermoelectric material is connected to the status indication unit via a signal cable passing through a sidewall of the chamber and a second terminal of the first thermoelectric is connected to the clapboard, and the first thermoelectric material deforms in response to the control signal as the operational status of the at least one of the fan body and the electronic apparatus changes, so as to move the clapboard to change a resonance volume of the resonator.

8. The fan module of claim 7, wherein the operational status of the fan body comprises a fan speed, and the operational status of the electronic apparatus comprises an operational temperature.

9. The fan module of claim 7, wherein the resonator further comprises:
a neck channel, having one end connected to an opening of the chamber and having another end connected to the silencing opening of the outlet tube,
wherein the clapboard separates a space in the chamber into a first space surrounded by the bottom of the chamber and the clapboard and a second space opposed to the first space,
wherein the first thermoelectric material is disposed in the first space, and the resonance volume is determined by the second space.

10. The fan module of claim 7, wherein the noise suppression apparatus further comprises:
a masking component, disposed in the neck channel; and
a second thermoelectric material, connected to the masking component, wherein the second thermoelectric material deforms in response to the control signal as the operational status of the fan body changes, so that the masking component blocks or opens the neck channel.

11. The fan module of claim 10, wherein the second thermoelectric material and the first thermoelectric material deform to different extents.

12. The fan module of claim 7, wherein the status indication unit comprises:
a heat conduction component, connected between the electronic apparatus and the first thermoelectric material, and conducting heat energy of the electronic apparatus, as the control signal, to the first thermoelectric material.

13. The fan module of claim 7, wherein the status indication unit comprises:
a control chip, according to different fan speeds of the fan body, correspondingly generating voltage of different levels, and transmitting the voltage as the control signal to the first thermoelectric material.

* * * * *